United States Patent [19]

Owen et al.

[11] Patent Number: 4,481,553
[45] Date of Patent: Nov. 6, 1984

[54] PROTECTION CIRCUIT

[75] Inventors: Louis L. Owen, West Chester; Mark P. Horujko, Fairfield; William G. Bools, Blue Ash, all of Ohio

[73] Assignee: General Electric Company, Cincinnati, Ohio

[21] Appl. No.: 365,734

[22] Filed: Apr. 5, 1982

[51] Int. Cl.$^3$ ............................................. H02H 7/20
[52] U.S. Cl. .................. 361/93; 330/207 P; 330/298; 361/98
[58] Field of Search ............ 361/74, 75, 86, 98, 361/100, 101, 93; 330/207 P, 298

[56] References Cited

U.S. PATENT DOCUMENTS

| | | | |
|---|---|---|---|
| 3,448,394 | 6/1969 | Rheaume | 330/11 |
| 3,461,399 | 8/1969 | Houpis et al. | 331/62 |
| 3,486,124 | 12/1969 | Eisenberg | 330/13 |
| 3,555,358 | 1/1971 | Gibbs | 361/75 X |
| 3,927,352 | 12/1975 | Schatz | |
| 3,931,547 | 1/1976 | Glogolja | |
| 3,979,643 | 9/1976 | Pelc | |
| 3,990,020 | 11/1976 | Porter | 330/207 P |
| 3,992,678 | 11/1976 | Suzuki | 330/207 P |
| 4,092,692 | 5/1978 | Smith et al. | 361/94 |
| 4,103,181 | 7/1978 | Moreau | 361/86 |
| 4,225,897 | 9/1980 | Kaplan | 361/87 |

FOREIGN PATENT DOCUMENTS

| | | |
|---|---|---|
| 1370806 | 10/1974 | United Kingdom . |
| 1374309 | 11/1974 | United Kingdom . |
| 1415476 | 11/1975 | United Kingdom . |
| 1458857 | 12/1976 | United Kingdom . |
| 1473365 | 5/1977 | United Kingdom . |
| 1546676 | 5/1979 | United Kingdom . |
| 1586495 | 3/1981 | United Kingdom . |
| 2027307 | 2/1980 | United Kingdom . |
| 2085246 | 4/1982 | United Kingdom . |

*Primary Examiner*—Harry E. Moose, Jr.
*Attorney, Agent, or Firm*—Gregory A. Welte; Derek P. Lawrence

[57] ABSTRACT

An overload protection circuit for an electrical signal source is disclosed in which an overcurrent in the signal source is sensed and the source is disabled for a predetermined time interval. If the overcurrent condition persists beyond the predetermined time interval, the turn-off cycle is repeated. The system is immune to overcurrent transients and the amplitude of the current which triggers turn-off, as well as the length of the predetermined time interval, may be selectively set.

1 Claim, 1 Drawing Figure

PROTECTION CIRCUIT

The Government has rights in this invention pursuant to contract no. N00019-76-C-0261 awarded by the Navy.

The present invention relates to protection circuitry for electrical devices and in particular to a circuit which senses an overload condition in an electrical signal source and which responds by turning off the signal source for a predetermined time interval.

BACKGROUND OF THE INVENTION

By way of example, the signal source which is to be protected may constitute an electrical signal amplifier. A short circuit in a load of the amplifier can cause the latter to supply current beyond its intended capacity and thereby to create an overload condition. In order to prevent the overload condition from damaging the amplifier, it is necessary to sense the onset of such a condition and to immediately terminate it, e.g. by turning off the amplifier, or by taking other appropriate action for preventing or limiting damage to the amplifier.

Prior art protection devices which are intended to operate in such situations typically sense the overload condition and turn off the amplifier in response. A common failing of this type of device is that it permanently turns off the amplifier. Should the overload condition be temporary or self-curing, rendering permanent turn-off unnecessary, the amplifier nevertheless remains turned off and must be reactivated by some predetermined procedure or program, or by the intervention of an operator.

Another disadvantage of many such prior art protection devices is that they utilize a sensing device having a slow response time, such as a sensing element heated by an overcurrent. Such prior art devices have limited effectiveness in that they respond only to overcurrent conditions of suffiently long duration at a predetermined threshold amplitude to trigger the sensing device. Thus, these slow-response devices sometimes allow damage to the amplifier to occur during the time interval which precedes the triggering of the device. Conversely, fast-acting protection devices found in the prior art are sometimes prone to false triggering by spurious signals that may be present in an electrically noisy environment.

A further disadvantage of some prior art devices of this type is that they respond only to overcurrents of a fixed magnitude. Thus, they are either not adjustable by the user, or they can be adjusted only with difficulty.

Accordingly, it is an object of the invention to provide a new and improved electrical protection circuit.

It is another object of the present invention to provide a new and improved electrical protection circuit for turning off an electrical signal source in the event of a current overload, followed by automatic turn-on of the signal source after a predetermined time interval has elapsed.

It is a further object of the present invention to provide a new and improved electrical protection circuit for turning off an electrical signal source in the event of a current overload, followed by automatic turn-on of the signal source after a predetermined time interval of selectable duration.

It is still another object of the present invention to provide a new and improved electrical protection circuit which is selectively adjustable to respond to overload conditions of different magnitudes.

It is still a further object of the present invention to provide a new and improved electrical protection circuit which responds rapidly to an overload condition.

It is yet a further object of the present invention to provide a new and improved electrical protection circuit which is relatively immune to false triggering by noise transients.

SUMMARY OF THE INVENTION

The foregoing and other objects of the present invention are achieved in one form of the present invention by providing an overload protection circuit wherein a control voltage is sensed which is indicative of the amount of current being supplied by a signal source. When the control voltage exceeds a predetermined threshold, a voltage pulse is generated which closes a switch for the pulse duration, connecting the input of the signal source to ground and thus turning off the signal source. At the end of the pulse the input is disconnected from ground, allowing normal operation to resume unless an overload condition is again sensed, in which case the turn-off cycle is repeated.

The foregoing objects of the invention, together with the features and advantages thereof, will become apparent from the following detailed description when read together with the accompanying drawing.

DETAILED DESCRIPTION OF THE INVENTION

Figure 1:
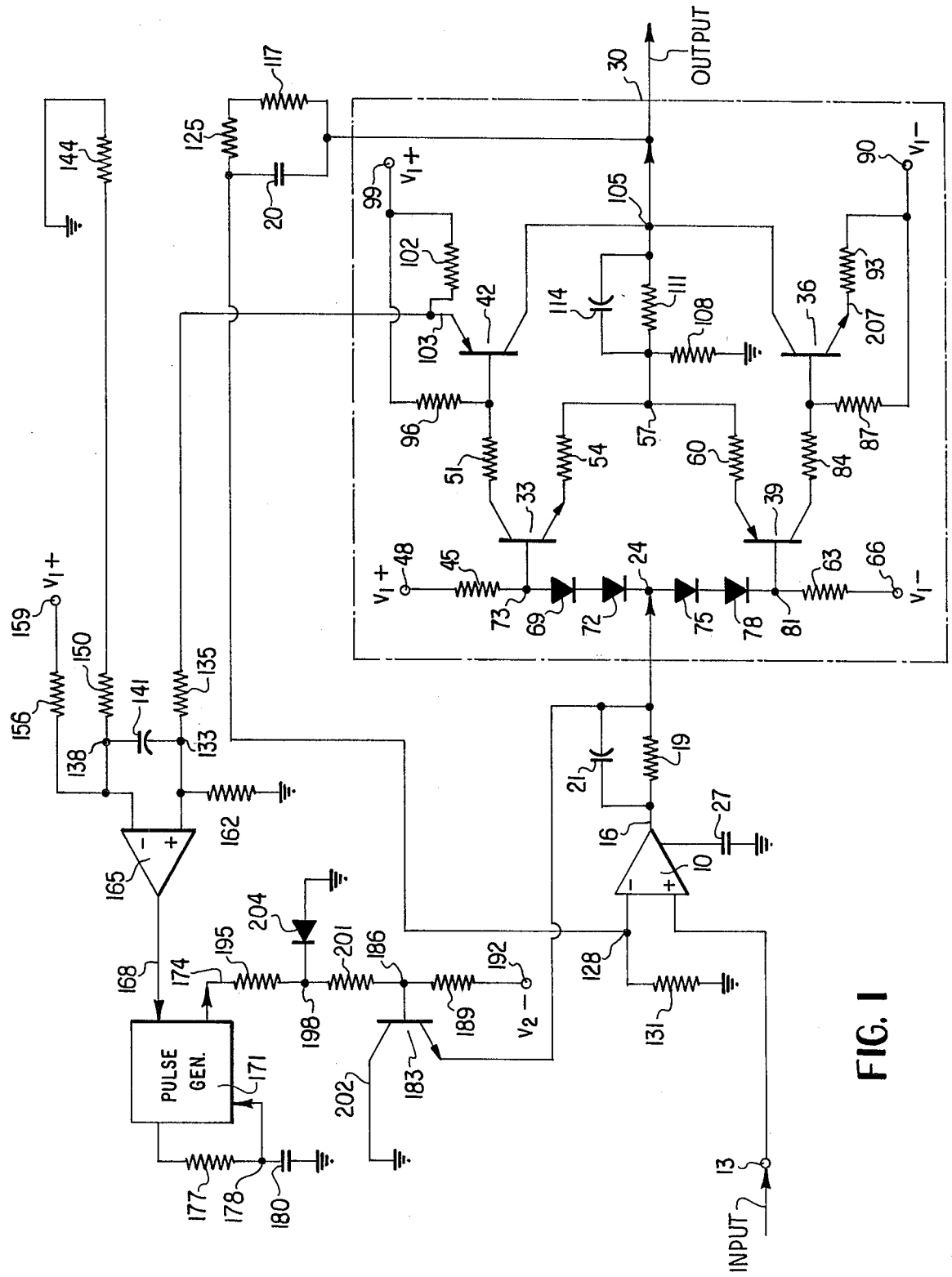
FIG. 1 is a schematic diagram of a preferred embodiment of the invention which is illustrated in conjunction with a push-pull amplifier.

With reference now to FIG. 1, an operational amplifier 10 serves to amplify the signal present at noninverting input node 13. The inverting input node 128 of amplifier 10 is coupled to ground by way of a resistor 131. An amplified signal is provided at output 16, which is coupled to a node 24 by way of a resistor 19 in parallel with a capacitor 21. Resistor 19 and capacitor 21 operate as a speed-up stage for the output signal of operational amplifier 10. A capacitor 27, which is connected to amplifier 10, is selected to provide high frequency roll-off in the gain-versus-frequency function of operational amplifier 10.

The signal present at node 24 is further amplified by a two-stage push-pull amplifier 30, which is shown enclosed by a broken line in the drawing. Push-pull amplifier 30 includes a pair of NPN transistors 33 and 36, as well as a pair of PNP transistors 39 and 42. A resistor 45 connects the base of transistor 33 of a node 48 to which a positive voltage $V_1+$ is applied. A resistor 51 connects the collector of transistor 33 with the base of transistor 42. A resistor 54 connects the emitter of transistor 33 with a node 57. Node 57 is connected to the emitter of transistor 39 through a resistor 60. A resistor 63 connects the base of transistor 39 with a node 66 to which a negative power supply voltage $V_1-$ is applied.

A pair of diodes 69 and 72 are connected in series between the base 73 of transistor 33 and node 24 such that current flows in the direction from base 73 to node 24. A pair of diodes 75 and 78 are connected in series between node 24 and base 81 of transistor 39, such that current flows in the direction from node 24 to base 81.

A resistor 84 is connected between the collector of transistor 39 and the base of transistor 36. A resistor 87 is connected between the base of transistor 36 and a node 90 to which the aforesaid negative voltage $V_1-$ is applied. A resistor 93 is connected between node 90 and the emitter of transistor 36. A resistor 96 is connected between the base of transistor 42 and a node 99 to which positive power supply voltage $V_1+$ is applied. A resistor 102 is connected between emitter node 103 of transistor 42 and node 99. The collectors of transistors 36 and 42 are both conected to a node 105.

Diodes 69, 72, 75 and 78 function to minimize crossover distortion. Such distortion can arise in a push-pull amplifier, inasmuch as such an amplifier alternately uses different transistors to amplify different portions of a signal. For example, transistor 33 amplifies the positive portions of the signal present at node 24, while transistor 39 amplifies the negative portions. Diodes 69 and 72 serve to establish a standing voltage across the base-emitter junction of transistor 33. The introduction of a positive signal portion at node 24 will cause a slight fluctuation in this established voltage which is amplified by transistor 33. Without this established voltage, small signals will be amplified proportionately less than large signals and distortion will result. The distortion is termed crossover distortion because it occurs when the signal switches, or crosses over, from positive to negative at node 24, thus shifting the signal path from transistor 33 to transistor 39.

A resistor 108 is connected between node 57 and ground and functions as an emitter-degeneration feedback resistance for providing feedback to transistors 33 and 39. Feedback to input node 128 of amplifier 10 is provided by an impedance network consisting of the parallel combination of resistor 111 and a capacitor 114, both connected between nodes 57 and 105; and by the network consisting of the parallel combination of a resistance connected between nodes 105 and 128 and comprising resistor 117 connected in series with resistor 125 together with a capacitor 20 connected between these two nodes. Resistor 131, which is connected between node 128 and ground, provides a voltage bias at node 128. Node 105 represents the output of push-pull amplifier 30 to which the load driven by this amplifier is connected.

Emitter 103 is further connected to a node 133 by way of a resistor 135. As shown in FIG. 1, node 133 is also connected to a node 138 by way of a capacitor 141. The voltage at node 138 is held relatively constant by a voltage divider network which comprises a resistive path from this node to ground, including a pair of series-connected resistors 150 and 144. The latter network further includes a resistor 156 connected between node 138 and a node 159. The voltage at node 159 is held constant at the $V_1+$ value. A resistor 162 is coupled between node 133 and ground.

Nodes 138 and 133 form a pair of inputs for a comparator 165, which is also referred to herein as a differential amplifier, whose output 168 is coupled to a pulse generator 171. A resistor 177 is connected between a timing interval reference input and a timing interval input of pulse generator 171. A capacitor 180 is connected between the timing interval input and ground. The variation in the voltage of node 178 during charging and discharging of capacitor 180 establishes the duration of pulses produced by pulse generator 171. The output 174 of pulse generator 171 is resistively coupled to a node 198 by means of a resistor 195. Node 198 is coupled to ground through a diode 204, as well as being coupled to a resistor 201 which is further connected to the base 186 of a transistor 183. The latter transistor is selected to have a very small collector-to-emitter saturation voltage, on the order of a few millivolts, when operated in the inverted mode. The emitter of transistor 183 is connected to the aforesaid node 24 which forms the input of push-pull amplifier 30. Transistor base 186 is further coupled to a node 192 by way of a resistor 189. A negative DC voltage $V_2-$ is applied to node 192.

In operation, excessive current flow through emitter 103 of transistor 42 may occur for a variety of reasons, for example due to a short circuit in the load. Such a short circuit has the effect of shorting node 105 to ground. An overcurrent of similar magnitude flows through resistor 102 and produces a voltage change at emitter 103. Specifically, during an overcurrent condition the voltage at emitter 103 will decrease from the normal positive operating voltage toward zero volts, due to the now greater voltage drop in resistor 102. The voltage excursion of emitter 103 acts as a control signal, or control voltage, which tends to draw node 133 to a less positive voltage by virtue of its connection to node 133 through resistor 135.

The voltage at node 133 differs from the constant voltage at which node 138 is held by the drop across capacitor 141. Since the voltage across capacitor 141 cannot change instantaneously, but can do so only as capacitor 141 charges or discharges, the voltage at node 133 can only follow the control voltage at emitter 103 to the extent that the voltage change across capacitor 141 allows it to do so. Accordingly, a rapid voltage transient at emitter 103, caused by a momentary current surge through resistor 102, will have virtually no effect on the voltage at node 133 if its duration is not sufficient to appreciably charge or discharge capacitor 141. Thus, capacitor 141 serves to filter out rapid overcurrent transients and to prevent these transients from affecting the voltage at node 133. The voltage at node 133 is determined principally by the voltage divider network which includes resistor 162, resistor 135 and resistor 102 connected between emitter 103 and node 99, as well as by the power supply already mentioned which holds node 99 at a fixed positive voltage.

The two voltages at nodes 133 and 138 are applied to the non-inverting and inverting inputs respectively, of comparator 165. This amplifier compares the two voltages and provides a responsive voltage at amplifier output 168 which is substantially proportional to the difference between the compared voltage values. When the voltage at output node 168 rises to a predetermined positive level, pulse generator 171 generates a positive voltage pulse at its output 174 of a time duration determined by resistor 177 and capacitor 180. It is to be understood that pulse generator 171 is preferably an integrated circuit. Thus, the particular configuration used to connect resistor 177 and capacitor 180 to the pulse generator will depend upon the electrical terminal configuration provided by the manufacturer. Accordingly, the configuration shown in FIG. 1 is intended to be illustrative only of an RC circuit connected to the pulse generator with resistor and capacitor values selected to obtain the desired time duration of the positive voltage pulse.

Prior to the onset of the pulse at output 174 of the pulse generator, the switch provided by NPN transistor 183 effectively presents an open circuit between node 24 and ground, due to the negative voltage applied to its base 186. The negative voltage is present because transistor base 186 is connected by resistor 189 to node 192, the latter being held at a predetermined negative voltage $V_2-$. However, within the duration of the pulse transistor 183 becomes conductive because of the positive voltage pulse at pulse generator output 174. The latter pulse is applied to base 186 by way of resistors 195 and 201. Thus, while the pulse is present transistor 183 effectively shorts node 24 to the grounded transistor collector 202, thus forcing the voltage of this node close to zero. When a pulse is not present at node 174, diode 204 functions to clamp the voltage of node 198 at a voltage which is approximately equal to ground or one diode voltage drop lower. This clamping protects pulse generator 171 from excesively negative voltages which may be introduced onto node 198.

As already mentioned, pulse generator 171 is triggered by the voltage on output 168 of voltage comparator 165. The latter voltage is substantially determined as either a high or a low voltage in response to the voltages on amplifier inputs 133 and 138. That is, comparator 165 compares the voltage present on node 133 with reference voltage on node 138 and when the reference voltage is exceeded, high voltage appears at output 168 of comparator 165.

The voltage difference between nodes 133 and 138, absent any overcurrent voltage signal from emitter 103 of transistor 42, can be adjusted by changing the values of resistors 102, 135, 162, 150, or of resistor 156. Further, the reference voltage on node 138 can be adjusted by changing the value of resistor 144. In practice, resistor 144 is likely to be a resistor which is external to the printed circuit board which typically carries the other resistors. Thus resistor 144 may be more readily accessible, making it the preferred resistor used for making adjustments in the voltage reference of inputs 133 and 138.

The adjustment of the resistor values, as outlined above, may alter the sensitivity of pulse generator 171 to overcurrent signals from node 103 by providing an abiding voltage difference between nodes 133 and 138. Such a voltage difference, as it appears in amplified form at output 168, may be adjusted to be very close to the trigger threshold of pulse generator 171. In such a case, a very small voltage change at node 103 can bring the voltage of output 168 of differential amplifier 165 to a level sufficient to trigger pulse generator 171.

The positive pulse produced by pulse generator 171 at output 174 drives transistor 183 into saturation. This action brings the voltage of node 24, i.e. the input node 24 of push-pull amplifier 30, very close to that of grounded collector 202. The condition continues for the duration of the pulse. The switching action so provided turns off push-pull amplifier 30 and thereby protects it from damage due to excessive current flow through transistor 42. At the termination of the pulse, output 174 returns to its previous voltage state, i.e. prior to the pulse, and transistor 183 is switched out of saturation. Simultaneously, node 24 is disconnected from ground and normal operation of push-pull amplifier 30 will ordinarily resume. If, at this time, an overcurrent condition still exists, the abnormal voltage at emitter 103 again triggers the above-described sequence which causes node 24 to be grounded and push-pull amplifier 30 to be turned off.

In summary, an overcurrent condition in transistor 42 is manifested by a deviation of the control voltage at emitter 103. If this deviation persists long enough to change the voltage of node 133 despite the stabilizing influence of capacitor 141, the level difference in voltage between nodes 133 and 138 will appear as a control signal at output 168 of comparator 165. When this control signal deviates sufficiently from a predetermined norm, i.e. when its voltage reaches the triggering threshold of pulse generator 171, a positive voltage pulse is generated at output 174 for a time interval which is determined by resistor 177 and capacitor 180. As explained above, the pulse causes the input of push-pull amplifier 30 to be grounded, thereby turning the amplifier off by driving transistor 183 into saturation. At the termination of the pulse, input 24 is disconnected from ground and normal operation is allowed to resume unless the overcurrent situation persists. In the latter case, the turn-off cycle is repeated.

The invention as described with reference to the specific example under discussion, serves to protect transistor 42 of push-pull amplifier 30 from damage by excessive current flow through the transistor. The present invention may be extended to additionally protect transistor 36 from excessive current flow. This may be implemented by substantially duplicating the protection circuit described. Thus, the voltage excursion at emitter 207 of transistor 36, due to an excessive current flowing through resistor 93, may be sensed and applied to the above-mentioned duplicate protection circuit. The duplicate circuit then generates a pulse of predetermined time duration and connects node 24 to ground by driving a transistor, analogous to transistor 183, into saturation for the duration of the pulse. However, it should be recognized that emitter 207 will have a positive voltage excursion as opposed to the negative excursion of emitter 103. Thus, as is well known in the art, the connection to the inverting and non-inverting inputs of the differential amplifier, which is analogous in the duplicate circuit to differential amplifier 165, must accordingly be modified to provide a positive voltage at its output.

The embodiment of the invention discussed above describes a protection circuit which senses the presence of an overcurrent condition in an amplifier and which rapidly turns off the amplifier in response. The amplifier is disabled for a predetermined time interval substantially commensurate in length with the duration of the disabling pulse, and it returns to normal operation automatically at the end of the time interval, provided the overcurrent condition has been removed. With such an arrangement the need for an operator to manually reactivate the amplifier is eliminated. In the event that the overcurrent condition has not been removed, the protection circuit will sense the overcurrent condition when the amplifier is reactivated and will repeat the turnoff cycle.

In accordance with the principles of the present invention, the length of time during which the amplifier remains disabled can be selectively set. Further, the protection circuit described herein can be selectively set to respond to overcurrents of different magnitude. Signals produced by rapid overcurrent transients are filtered out. Thus, false triggering, which is a common occurrence in an electrically noisy environment, is substantially eliminated.

While the invention has been described in conjunction with a push-pull amplifier, it will be understood that it is not so limited and that it can be used to protect other types of electrical signal sources, both AC and DC sources. Further, although the control signal derived at emitter 103 of transistor 42 may indicate an amplifier overload condition in the example discussed herein, its deviation from a predetermined norm may also represent other operating conditions of the signal source relative to which the signal source can be controlled, e.g. by disabling it.

Resistance 144 is shown and described as a fixed resistor. Its value may be used to determine the sensitivity of the protection circuit to overcurrents of different magnitude, although other circuit parameters may also be used to accomplish the same purpose. Rather than replacing resistor 144 with other resistors of different value in order to set the required amplitude of the overcurrent which will cause the amplifier to be disabled, it will be readily seen that a variable resistance may be substituted.

Resistor 177 and capacitor 180 were described above as determining the duration of the voltage pulse that turns on transistor 183 and which shorts input node 24 to ground. While these components are shown and described as having a fixed value, it will be understood that variable components may be substituted.

It should be noted that grounding node 24 turns off the entire push-pull amplifier 30 despite the fact that the signal triggering the turn-off may originate at a part of the amplifier 30 such as at transistor 42. Thus, transistor 36 would be protected as well as transistor 42 for the time when the amplifier 30 is turned off.

From the foregoing discussion, it will be clear that the invention lends itself to numerous variations, modifications, substitutions, changes and equivalents which will now occur to those skilled in the art. Accordingly, the invention is intended to be limited only by the spirit and scope of the appended claims.

What is claimed is:

1. An overcurrent protection circuit for a transistor (42) which is contained in the final stage of an amplifier (30) having an input (24), comprising:
   (a) a resistor (135) connected between the emitter (103) of the transistor (42) and the noninverting input of a differential amplifier (165);
   (b) a resistor (162) connected between the noninverting input and ground;
   (c) a resistor (156) connected between the inverting input of the differential amplifier (165) and a first voltage source (V1+);
   (d) a pair of resistors (150 and 144) connected in series between the inverting input of the differential amplifier (165) and ground, one of the resistors being variable;
   (e) a pulse generator connected to the output of the differential amplifier (165);
   (f) a resistor (177) and a capacitor (180) coupled to the pulse generator (171) for determining the duration of the pulse produced by the pulse generator;
   (g) a pair of resistors (195 and 201) connected in series between an output (174) of the pulse generator (171) and the base of an NPN transistor (183) and defining a node (198) therebetween;
   (h) a diode (204) connected between node (198) and ground and poled such that current flows from ground to node (198);
   (i) a resistor (189) connected between the node (198) and a negative voltage source (V2−);
   (j) a lead connected between the collector of the NPN transistor (183) and ground;
   (k) a lead connected between the emitter of the transistor (183) and the input (24) of the amplifier (30),
   (l) a resistor (102) connected between the emitter (103) of the transistor (42) and the first voltage source (V+),
wherein, in the absence of an overcurrent condition through emitter (103), negative voltage source (V2−) turns off NPN transistor (183), thus effectively disconnecting the input (24) from ground, but in the presence of an overcurrent condition, an excursion of the voltage of the emitter (103) in a direction away from the voltage of first voltage source (V1+) causes the differential amplifier (165) to produce an amplified voltage which is substantially proportional to the difference between the voltages at its inputs, and when the amplified voltage reaches a predetermined threshold, the pulse generator produces a positive pulse which turns on transistor (183), thereby effectively connecting input (24) to ground, thereby turning off the amplifier for the duration of the pulse and then allowing the amplifier (30) to turn on again at the end of the pulse, and
wherein the pulse generator (171) is activated both in response to an overcurrent through resistor (102) and in response to a short through resistor (102).

* * * * *